US 8,809,195 B2

(12) United States Patent
Elers

(10) Patent No.: US 8,809,195 B2
(45) Date of Patent: Aug. 19, 2014

(54) ETCHING HIGH-K MATERIALS

(75) Inventor: Kai-Erik Elers, Vantaa (FI)

(73) Assignee: ASM America, Inc., Phoenix, AZ (US)

(*) Notice: Subject to any disclaimer, the term of this patent is extended or adjusted under 35 U.S.C. 154(b) by 1094 days.

(21) Appl. No.: 12/254,652

(22) Filed: Oct. 20, 2008

(65) Prior Publication Data
US 2010/0099264 A1 Apr. 22, 2010

(51) Int. Cl.
*H01L 21/302* (2006.01)

(52) U.S. Cl.
USPC .............. 438/706; 438/723; 438/773; 216/73

(58) Field of Classification Search
USPC ......... 438/704, 706, 710, 712, 714, 745, 720, 438/742, 723, 734, 773, 774; 216/73, 74
See application file for complete search history.

(56) References Cited

U.S. PATENT DOCUMENTS

| | | | |
|---|---|---|---|
| 5,447,598 A * | 9/1995 | Mihara et al. .................... | 216/46 |
| 5,731,634 A | 3/1998 | Matsuo et al. | |
| 5,868,852 A | 2/1999 | Johnson et al. | |
| 6,306,756 B1 | 10/2001 | Hasunuma et al. | |
| 6,656,540 B2 | 12/2003 | Sakamoto et al. | |
| 6,746,615 B1 * | 6/2004 | Ellis ................................ | 216/57 |
| 6,857,433 B2 | 2/2005 | Henderson et al. | |
| 2004/0008827 A1 | 1/2004 | Martin et al. | |
| 2004/0055621 A1 | 3/2004 | McDermott et al. | |
| 2005/0215062 A1 * | 9/2005 | Miyagawa et al. ........... | 438/706 |
| 2005/0266691 A1 | 12/2005 | Gu et al. | |
| 2007/0155181 A1 * | 7/2007 | Chen et al. .................... | 438/706 |
| 2008/0081483 A1 * | 4/2008 | Wu ................................ | 438/714 |
| 2008/0087890 A1 * | 4/2008 | Ahn et al. ........................ | 257/43 |
| 2008/0145797 A1 * | 6/2008 | Verbeke et al. ............... | 430/322 |
| 2009/0071505 A1 * | 3/2009 | Miya et al. ..................... | 134/1.1 |

FOREIGN PATENT DOCUMENTS

WO WO 2004/008827 A2 1/2004

* cited by examiner

*Primary Examiner* — Lan Vinh
(74) *Attorney, Agent, or Firm* — Knobbe Martens Olson & Bear LLP

(57) ABSTRACT

A dry etch method, apparatus, and system for etching a high-k material comprises sequentially contacting the high-k material with a vapor phase reducing agent, and a volatilizing etchant in a cyclical process. In some preferred embodiments, the reducing agent and/or volatilizing etchant is plasma activated. Control over etch rate and/or selectivity are improved by the pulsed process, where, in some embodiments, each step in the cyclical process has a self-limited extent of etching. Embodiments of the method are useful in the fabrication of integrated devices, as well as for cleaning process chambers.

37 Claims, 5 Drawing Sheets

ETCHING HIGH-K MATERIALS

BACKGROUND OF THE INVENTION

1. Field of the Invention

The present disclosure relates to generally to high-k materials, and in particular, to apparatus, systems, and methods for etching high-k materials.

2. Description of the Related Art

Among the hurdles to the continued miniaturization of microelectronic components are the physical limits imposed by the materials from which the components are fabricated. For example, as the thickness of a silicon dioxide gate dielectric, also referred to as an oxide gate dielectric, for a MOSFET (metal-oxide semiconductor field-effect transistor) approaches about 1 nm, the leakage current exceeds the standard specified in the International Roadmap for Semiconductors (ITRS). One approach to solving this problem is to replace the silicon oxide in the gate dielectric with a material with a higher dielectric constant or permittivity (κ or k). Such materials are referred to as high-k dielectric materials, or simply high-k materials.

One measure of a gate dielectric material is the equivalent oxide thickness (EOT), defined as the thickness of the gate dielectric material equivalent to a given thickness of silicon dioxide. A high-k material has an EOT less than 1, that is, a gate dielectric made from a high-k material is thicker than the equivalent oxide gate. Although it seems counterintuitive to use a thicker layer of material to construct a smaller device, this thicker layer eliminates leakage current through the dielectric arising from tunneling. Moreover, these thicker layers are generally more manufacturable than the extremely thin silicon dioxide layers that they replace. Although it is possible to deposit consistent, thin silicon dioxide gate dielectrics under laboratory conditions, commercially producing devices with oxide gate dielectrics of such dimensions is challenging. Furthermore, scaling with silicon oxide is also limited by physical limitations, for example, tunneling. Similar considerations apply to capacitor dielectrics. One consequence of these manufacturing difficulties is reduced reliability of the devices.

The manufacture of integrated devices includes masking, patterning, deposition, and etching steps for many of the materials used in the fabrication of a device. Because these steps are typically carried out sequentially, a single slow or inefficient step can disrupt the workflow of the entire manufacturing process. The cleaning cycles of the manufacturing devices can also affect workflow. For example, a slow cleaning step will either reduce the throughput of the entire manufacturing line, or necessitate acquisition of redundant manufacturing capacity.

Many high-k materials, for example, $Al_2O_3$, $HfO_2$, $ZrO_2$, and $Ta_2O_5$, are etchable using plasma activated $BCl_3$. It is believed that energetic chlorine species, for example, chlorine radicals, are the etching species. Other etching processes for high-k materials use other thermal and/or plasma activated halide species. These methods are often inadequately selective, etching more than the intended layers, however, and as such, are difficult to control.

SUMMARY OF THE INVENTION

A dry etch method, apparatus, and system for etching a high-k material comprises sequentially contacting the high-k material with a vapor phase reducing agent, and a volatilizing etchant in a cyclical process. In some preferred embodiments, the reducing agent and/or volatilizing etchant is plasma activated. Control over etch rate and/or selectivity are improved by the pulsed process, where, in some embodiments, each step in the cyclical process has a self-limited extent of etching. Embodiments of the method are useful in the fabrication of integrated devices, as well as for cleaning process chambers.

Some embodiments provide method of etching a high-k material, comprising the sequential steps of: (a) contacting a high-k material with a pulse of a vapor phase reducing agent; and (b) contacting the high-k material with a pulse of a vapor phase volatilizing etchant, thereby removing at least a portion of the high-k material.

In some embodiments, steps (a) and (b) are cyclically repeated until a desired amount of the high-k material has been removed. In some embodiments, each cycle of repeating steps (a) and (b) removes from about 5 Å to about 100 Å of the high-k material.

In some embodiments, each of step (a) and step (b) is substantially self-limiting.

Some embodiments further comprise purging with an inert gas after at least one of step (a) or step (b).

In some embodiments, at least one of step (a) or step (b) is plasma assisted. In some embodiments, a plasma is generated in situ. In some embodiments, a plasma is generated remotely.

In some embodiments, the vapor phase reducing agent comprises a hydrogen plasma. In some embodiments, the hydrogen plasma is generated using one or more parameters are selected from the group consisting of RF power on time, RF power amplitude, RF power frequency, reactant concentration, reactant flow rate, reaction space pressure, total gas flow rate, reactant pulse duration, reactant pulse separation, and RF electrode spacing.

Some embodiments further comprise removing the volatilizing etchant after step (b). In some embodiments, removing comprises purging with an inert gas. In some embodiments, removing comprises contacting the vapor phase with a vacuum source.

In some embodiments, the volatilizing etchant comprises at least one of a reactive halide species, a β-diketonate, an alcohol, an amine, a phosphine, an alkene, an alkyne, and carbon monoxide. In some embodiments, the volatilizing etchant comprises a reactive halide species formed in situ from a halide source material selected from the group consisting of metal halides, organic halogen compounds, elemental halogens, interhalogens, hydrogen halides, cyanogen halides, non-metal halides, and combinations thereof. In some embodiments, the halide source material is selected from the group consisting of $TiCl_4$, $ZrCl_4$, $NbCl_5$, $TaCl_5$, $MoCl_6$, $WCl_6$, $BCl_3$, $CF_2Cl_2$, and combinations thereof. In some embodiments, the volatilizing etchant comprises a β-diketone.

In some embodiments, contacting the high-k material with the vapor phase reducing agent forms a reduced high-k material comprising an elemental metal. In some embodiments, the volatilizing etchant substantially does not etch the unreduced high-k material under the contacting conditions. In some embodiments, at least a portion of the reduced high-k material forms a layer up to about 200 Å thick.

In some embodiments, the high-k material is substantially completely etched away.

In some embodiments, the high-k material is formed over at least a portion of a semiconductor substrate. In some embodiments, the high-k material is formed over at least a portion of a reaction apparatus. In some embodiments, the high-k material is formed using at least one of a CVD-type process and an ALD-type process. In some embodiments, the high-k material comprises a material selected from $Al_2O_3$, $TiO_2$, $ZrO_2$, $HfO_2$, $Nb_2O_5$, $Ta_2O_5$, $MoO_x$, $WO_x$, metal silicates, metal titanates, strontium bismuth tantalates, barium strontium titanates, and combinations thereof.

Some embodiments provide a method for etching a high-k material comprising cyclically: contacting a high-k material formed over a surface with a vapor phase reducing agent effective for reducing at least a portion of the high-k material, thereby forming a reduced material therefrom; and contacting the reduced material with a vapor phase reactive halide species effective for etch at least a portion the reduced material.

In some embodiments, the surface is at least a portion a semiconductor wafer. In some embodiments, the surface is at least a portion of a high-k deposition apparatus.

In some embodiments, at least one of the contacting steps comprises pulsing with the aid of a carrier gas.

For purposes of summarizing the invention and the advantages achieved over the prior art, certain objects and advantages of the invention have been described above and as further described below. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the disclosure. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

The invention will be better understood from the Detailed Description of the Preferred Embodiments and from the drawings, which illustrate preferred embodiments and are not meant to limit the disclosure.

DETAILED DESCRIPTION OF THE PREFERRED EMBODIMENTS

Oxides and oxynitrides of transition metals, non-transition metals, aluminum, and combinations thereof are used in the fabrication of integrated circuits and devices, for example, as high-k dielectric materials. Such high-k materials comprise $Al_2O_3$, $ZrO_2$, $HfO_2$, $Ta_2O_5$, and/or other metal oxides. Examples of other high-k materials include metal silicates and ternary oxides. Some applications use combinations of these materials. Suitable high-k materials preferably have dielectric constants greater than about 5, preferably greater than about 10. Some of these materials are difficult to etch, possibly because they resist reduction. Known effective etch techniques tend to be inadequately selective and therefore difficult to stop on underlying materials.

Selective etching of high-k materials is useful in the manufacture of integrated circuits and devices, for example, when etching a high-k material over which a patterned mask is formed. In some embodiments, the high-k layer is formed over a semiconductor substrate, for example, in the manufacture of a transistor. In other embodiments, the high-k layer is formed over a metal or metallic electrode structure, for example, in the manufacture of a capacitor. In either case, the disclosed etching conditions selectively etch the high-k material compared with the substrate. Those skilled in the art will appreciate that the disclosed method is also useful in the manufacture of other devices.

Figure 1:
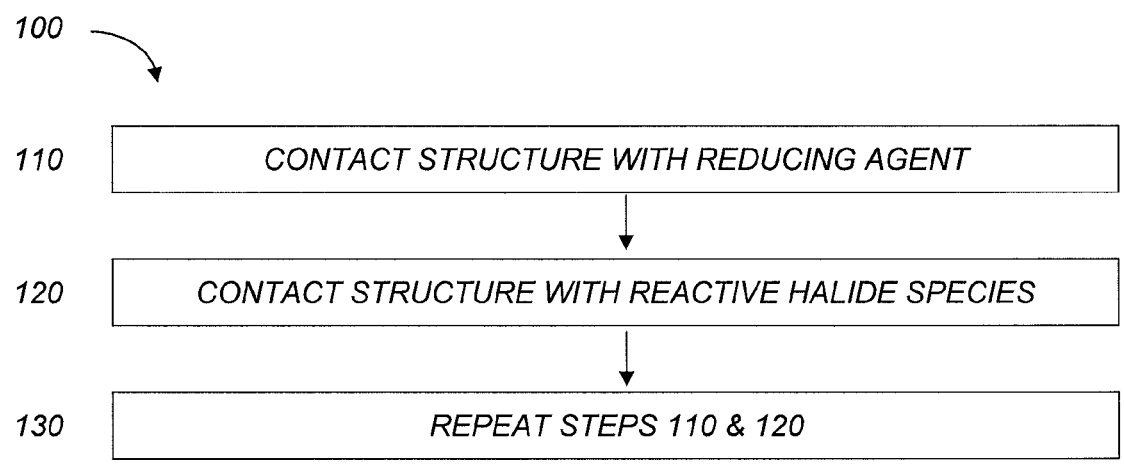
FIG. 1 is a flowchart illustrating an embodiment method for etching a high-k material.
Figure 2A:
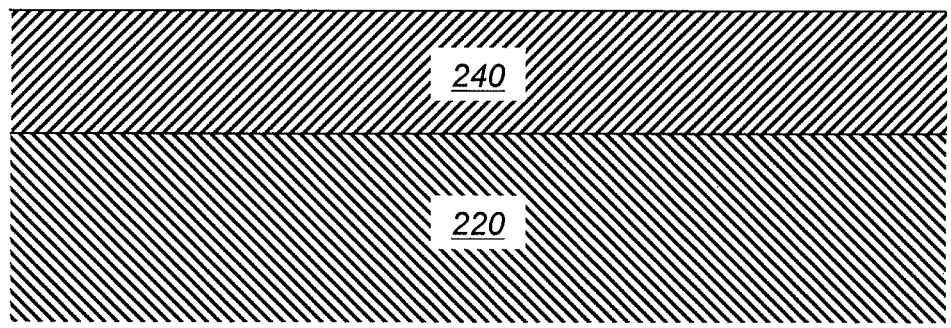
FIGS. 2A-2E illustrate cross sections of an exemplary sample comprising a high-k material during different stages of the etching method illustrated in FIG. 1.
Figure 2B:
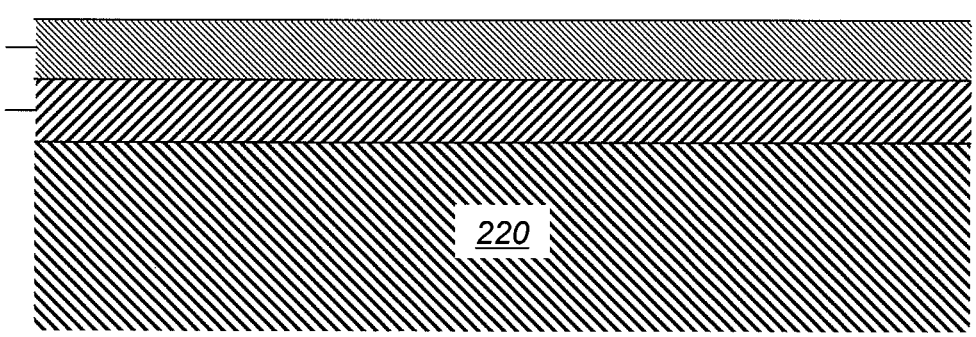
Figure 2C:
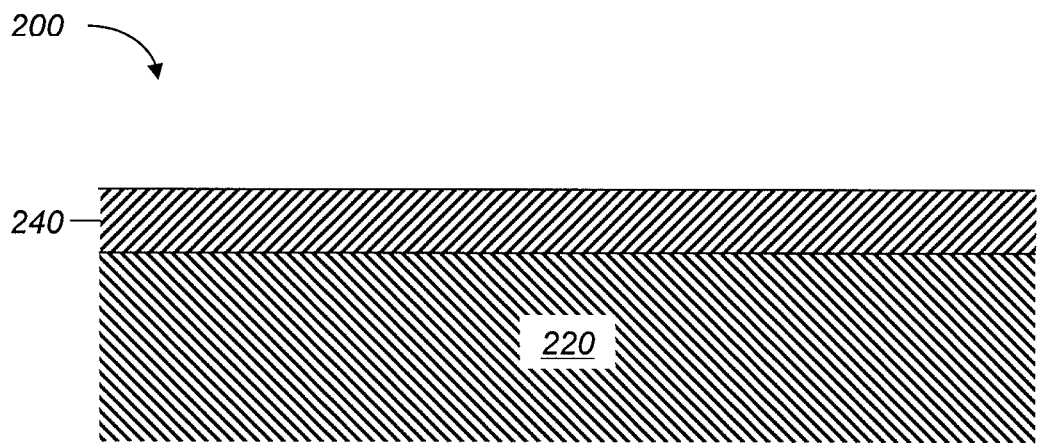
Figure 3:
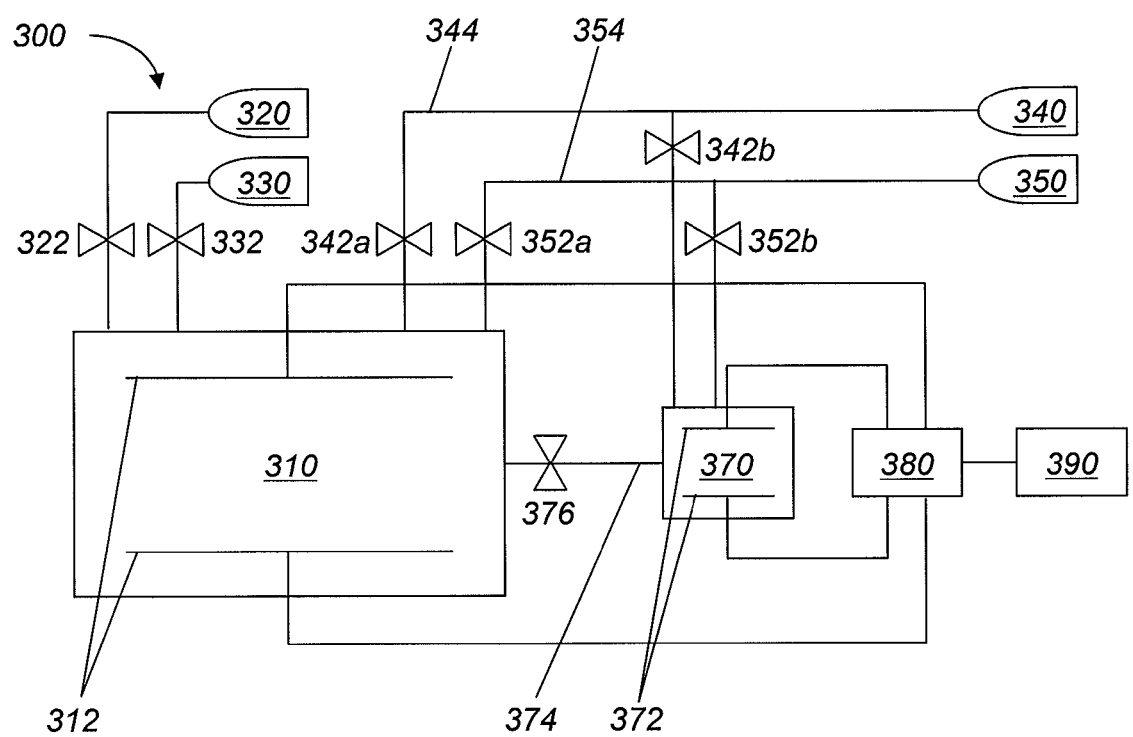
FIG. 3 is a schematic view of a vapor deposition chamber configured to deposit a high-k material and to etch or clean residual high-k material, in the manufacture of integrated devices and/or from reactor surfaces between deposition cycles.

FIG. 1 is a flowchart illustrating an embodiment of a method 100 for etching a high-k material from a structure 200, with reference to FIGS. 2A-2C, which illustrate different stages of the etching process on an embodiment of the structure 200, and FIG. 3, which illustrates an embodiment of an apparatus 300 suitable for performing the method 100. In step 110, a structure 200 comprising a high-k material is contacted with a reducing agent. In step 120, the structure 200 is contacted with a volatilizing etchant. In step 130, steps 110 and 120 are repeated, for example, in a cyclical process. Notably, some embodiments of the method 100 are dry-etch methods, as discussed in greater detail below.

FIG. 3 schematically illustrates an embodiment of a CVD-type and/or ALD-type apparatus 300 suitable for etching a high-k material according to the embodiment of the method 100 illustrated in FIG. 1. The apparatus 300 comprises a reaction chamber 310, a remote plasma generator 370, a plasma power source 380, and a control unit 390. The illustrated embodiment is configured with both in situ and remote plasma sources. Other embodiments comprise only an in situ plasma source or a remote plasma source.

A plurality of reactant sources, 320 and 330, used in a CVD and/or ALD deposition process are fluidly connected to the reaction chamber 310 through valves 322 and 332, respectively. The illustrated embodiment is equipped with two reactant sources, although one skilled in the art will understand that other embodiments comprise a different number of reactant sources, and/or a different configuration, for example, fluid connection to the reaction chamber 310 through one or more manifolds.

A source 340 of a reducing agent and/or precursor thereof, for example, hydrogen gas, is fluidly connected to the reaction chamber 310 through a valve 342a and a manifold 344. A source 350 of a volatilizing etchant is fluidly connected to the reaction chamber 310 through a valve 352a and a manifold 354. In the illustrated embodiment, manifolds 344 and 354 are also fluidly connected to the remote plasma generator 370 through valves 342b and 352b, respectively, thereby supplying the remote plasma generator 370 with the reducing agent and/or precursor thereof, and/or volatilizing etchant.

The reaction chamber 310 further comprises a set of plasma electrodes 312 electrically connected to the plasma power source 380. The remote plasma source 370 also comprises a set of plasma electrodes 372 in electrical connection with the plasma power source 380. Those skilled in the art will understand that some embodiments comprise separate power sources for the in situ plasma electrodes 312 and the remote plasma electrodes 372. The reaction chamber 310 and the remote plasma generator 370 are fluidly connected through conduit 374 and valve 376.

The plasma power source 380 is of any type known in the art suitable for generating a suitable plasma in the reaction chamber 310 and/or remote plasma generator 370. Typically, the plasma power source is configured to apply radio frequency (RF) power to the plasma electrodes 312 and/or 372 at a power, and frequency or frequencies effective for generating a plasma. Those skilled in the art will understand that the particular parameters used to generate the plasma, for example, the RF frequency and RF power, will depend on a variety of factors, including the identity of the plasma precursor gas(es), the presence and identity of an inert gas(es), the gas pressure, the configuration of the electrodes, and the like. Preferably, the plasma power source 380 is configured to provide RF power appropriate to the reaction chamber electrodes 312 and/or the remote plasma generator electrodes 372 as required. Those skilled in the art will understand that some embodiments use separate plasma power sources to drive the reaction chamber electrodes 312 and the remote plasma generator electrodes 372.

The control unit 390 is configured to control the apparatus 300 to execute at least the method 100 illustrated in FIG. 1 and described in greater detail below. As such, the control unit 390 is any type of control unit known in the art, and comprises, for example, one or more computers, microprocessors, embedded processors, or the like, as well as instructions in machine readable format that when executed, perform the method 100. In the illustrated embodiment, the control unit 390 is configured to control at least the plasma power source 380, valves 342*a*, 342*b*, 352*a*, 352*b*, and 376. Preferably, the control unit 390 is also configured to control other components of the apparatus 300, for example, valves 322 and 332, as well as other components not illustrated in FIG. 3, and is programmed to perform other methods, for example, for performing CVD and/or ALD deposition. Accordingly, some embodiments of the apparatus 300 also comprise other components known in the art that are controlled by the control unit 390, for example, a gate valve, an inert gas source, a vacuum source, heating means, a substrate support, additional gas sources for the remote plasma generator, and the like.

As discussed above, some embodiments of the apparatus are useful for depositing a high-k material using a CVD- and/or ALD-type process. For example, in some embodiments, the reactant source 320 is a metal source and the reactant source 330 is an oxygen source. In some embodiments of a CVD-type process, a semiconductor substrate (not illustrated) is exposed to the metal source 320 and oxygen source 330 substantially simultaneously, thereby depositing a high-k material on the semiconductor substrate. In some embodiments of an ALD-type process, a semiconductor substrate (not illustrated) is exposed to sequential pulses of the metal source 320 and oxygen source 330, thereby depositing a high-k material on the semiconductor substrate. Those skilled in the art will understand that some embodiments of CVD- and/or ALD-type processes are plasma enhanced using an in situ and/or remote plasma generated using the plasma electrodes 312 and/or 372. After a number of high-k deposition procedures, portions of the reaction chamber 310 accumulate significant amounts of high-k material, which are cleaned using the method 100.

FIG. 2A is a cross section of a structure 200 comprising a surface 220 on which a high-k material 240 is deposited. In some embodiments, the surface 220 is a surface of a partially manufactured integrated device. The integrated device is fabricated on any suitable substrate known in the art, for example, a semiconducting substrate. Examples of suitable semiconductor substrates include single crystal silicon, polycrystalline silicon, amorphous silicon, strained silicon, germanium, silicon-germanium, gallium arsenide, indium phosphide, cadmium selenide, indium tin oxide, II-VI semiconductors, III-V semiconductors, and the like. In some embodiments, the integrated device is fabricated on and/or comprises one or more insulating layers or materials known in the art, for example, silicon oxide, silica, aluminum oxide, sapphire, glass, photoresist, polymers, and the like. In some embodiments, the integrated device comprises one or more conductive materials known in the art, for example, copper and/or aluminum. In some preferred embodiments, the substrate is a semiconductor wafer. In the etching process, the structure 200 is disposed in the reaction chamber 310.

In other embodiments, the surface 220 is a surface of an apparatus on which a high-k material is deposited, for example, a reaction chamber 310 and components disposed therein of a plasma enhance atomic layer deposition (PEALD) apparatus 300 and/or plasma enhanced chemical vapor depositions (PECVD) apparatus 300. Typically, in the deposition of a high-k layer on a substrate, some material is also deposited on surfaces of the deposition apparatus 300. Periodically, the affected surfaces of the apparatus 300 are cleaned of this contaminating material. The affected surfaces are any material known in the art, for example, metal, aluminum, stainless steel, titanium, glass, silica, alumina, passivation layers, polymers, and mixtures and/or alloys of the same. As discussed in greater detail below, some embodiments of the method 100 comprise a dry etch, in situ cleaning process resulting in reduced down-time for the apparatus 300 and an improved workflow.

The high-k material 240 is any material etchable using the disclosed method, for example, metal oxides, particularly transition metal oxides, ternary high-k compounds (e.g., metal silicates, titanates, and tantalates). Particular examples include $Al_2O_3$, $TiO_2$, $ZrO_2$, $HfO_2$, $Nb_2O_5$, $Ta_2O_5$, $MoO_x$ (e.g., $MoO_3$), $WO_x$ (e.g., $WO_3$), metal silicates (e.g., $M_xSi_yO_z$) metal titanates (e.g., $Sr_xTi_yO_z$), strontium bismuth tantalates (e.g., $SrBi_2Ta_2O_9$, SBT), barium strontium titanates (e.g., $Ba_{1-x}Sr_xTiO_3$, BST), and/or mixtures, blends, and/or solid solutions thereof. In some preferred embodiments, the dielectric constant (k) of the high-k material is greater than about 5 or greater than about 10. The high-k material is deposited or formed using any method known in the art, for example, by atomic layer deposition (ALD), plasma-enhanced ALD (PEALD), radical enhanced ALD (REALD), chemical vapor deposition (CVD), metal organic CVD (MOCVD), or plasma enhanced CVD (PECVD). In some preferred embodiments, the high-k material is deposited by ALD-type process, for example, by ALD and/or PEALD. Principles of ALD-type processes are disclosed, for example, in T. Suntola, in Handbook of Crystal Growth 3, Thin Films and Epitaxy, Part B: Growth Mechanisms and Dynamics, Chapter 14, Atomic Layer Epitaxy, pp. 601-663, Elsevier Science B.V. (1994), the disclosure of which is incorporated by reference. For example, in some embodiments, an $HfO_2$ layer is deposited by ALD using $HfCl_4$ and $H_2O$ as precursors. The substrate is first contacted with a pulse of $HfCl_4$ vapor in a reaction chamber. The reaction chamber is then purged, for example, using an inert gas. The substrate is then contacted with a pulse of $H_2O$ vapor, thereby forming a layer of $HfO_2$. The reaction chamber is again purged, and the process repeated until an $HfO_2$ layer with the desired thickness is formed.

The high-k material 240 is typically in the form of one or more layers of a single high-k material or of a plurality of high-k materials. For example, in embodiments in which the surface 220 is a surface of a deposition apparatus, a number of depositions of the high-k material are performed between the cleanings. Consequently, in some these embodiments, the number of layers of high-k material deposited on the surface 220 of the apparatus is substantially the same as the number of depositions performed in the apparatus since the previous cleaning. In some embodiments, multiple depositions of a high-k material result in a single substantially integral layer. In other embodiments, the high-k material 240 is in the form of particles, aggregates, conglomerates, and the like, while in other embodiments, the high-k material 240 has characteristics of both lamellar and particulate morphologies. Those skilled in the art will understand that the morphology of the high-k material 240 depends on factors known in the art, for example, deposition conditions, the properties of the particular high-k material, and changes induced by post-deposition processing. For example, post-deposition thermal treatments are useful in annealing, thermally fracture, phase separation, crystallization, sintering, and the like. Other examples of post-deposition processing include treatment with reactive species, radiation treatment, etching of other materials, and the like.

In step 110, the structure 200 is contacted with a vapor phase reducing agent, thereby converting at least a portion of the high-k material 240 into a reduced material 260. In some embodiments, the reducing agent comprises the products of a hydrogen plasma, for example, plasma-excited species including ground and excited state hydrogen radicals (H*), hydrogen ions (H$^+$, H$_2^+$), and other reactive hydrogen species known in the art. As used herein, the term "plasma" includes the products, active species, and/or excited species generated in a plasma or glow discharge. In embodiments in which the etching is performed in a PEALD and/or a PECVD, for example, in cleaning the deposition apparatus 300, the apparatus 300 already comprises a means for generating a plasma, for example, an in situ plasma generator (electrodes 312) and/or a remote plasma generator 370. For example, in situ generation of plasma-excited species of hydrogen in the reaction space using a showerhead-type PEALD reactor is disclosed in U.S. Patent Publication No. 2004/0231799 A1, the disclosure of which is incorporated by reference. Examples of suitable remote plasma generators are known in the art. Suitable generators are commercially available, for example, from MKS Instruments, Inc. (Wilmington, Mass.). In some embodiments, the etching is performed in a dedicated etch tool, for example, in embodiments in which the structure 200 is an integrated device.

Methods and conditions for generating a hydrogen plasma are known in the art. Some embodiments use an optional carrier or inert gas known in the art, for example, helium, and/or argon. The generation and properties of the plasma depend on parameters known the art, including, RF power on time, RF power amplitude, RF power frequency, reactant concentration, reactant flow rate, reaction space pressure, total gas flow rate, reactant pulse duration, reactant pulse separation, RF electrode spacing, and combinations thereof. Other parameters will apply for other methods of plasma generation (e.g., microwave, inductive, UV, etc.). Optimization of these parameters is within the knowledge of the skilled artisan. Examples of suitable parameters for generating and sustaining a hydrogen plasma are provided in TABLE I.

TABLE I

| | |
|---|---|
| H$_2$ | about 10-10000 sccm |
| Inert gas | about 10-5000 sccm |
| Reactor Pressure | about 0.01-10 torr |
| Processing Time | about 5-30 sec |
| RF power | about 50-500 W |

Those skilled in the art will understand that the contact time between the structure 200 and hydrogen plasma depends on a variety of factors, including the identity of the high-k material 220, the morphology of the high-k material 220, the reactivity of the active species of the hydrogen plasma, the temperature, the pressure, and/or the desired degree of reduction of the high-k material. Exemplary contact times are from about 0.5 to about 20 sec, more preferably, from about 0.5 to about 2 sec. In some embodiments, the contact between the reducing agent and the structure 200 is substantially continuous. In other embodiments, the contact is not continuous. For example, in some preferred embodiments, the reducing agent is pulsed in a sequence comprising a pulse duration and a pulse separation. Suitable pulse durations are from about 0.5 sec to about 5 sec. Suitable pulse separations are from about 1 sec to about 2 sec. In some embodiments, the total number of pulses of reducing agent is up to about 1,000, preferably, up to about 500. Those skilled in the art will understand that in embodiments in which the reducing agent is a hydrogen plasma, pulsing is accomplished by pulsing the hydrogen gas and/or pulsing the RF power source.

Other embodiments use another reducing agent, for example, boranes (B$_a$H$_b$), boron halides (B$_a$X$_b$), borane halides (B$_a$H$_b$X$_c$), silanes (Si$_a$H$_b$), and/or organic silanes (Si$_a$H$_b$R$_c$, where each R is independently an organic radical, for example, an alkyl group, and b>0). Combinations of these reducing agents, with or without hydrogen, are also useful in some embodiments. The reducing agent and/or combinations of reducing agents can be employed in the cyclical reduction/etching process described herein with or without plasma activation in the reduction step.

In some embodiments, the vapor phase reducing agent is removed after the reduction of the high-k material in step 110, for example, by purging with a gas and/or by fluidly connecting the vapor phase with a vacuum source. In some embodiments, the gas comprises an inert gas known in the art, for example, N$_2$, He, and/or Ar. Other vapor phase species are also removed, for example, water vapor formed in the reduction reaction, byproducts of the reduction reaction, and/or plasma byproducts. Those skilled in the art will understand that in embodiments in which the reducing agent is a hydrogen plasma, the plasma and plasma excited species cease to exist when the plasma discharge is terminated. In these embodiments, hydrogen, the precursor of the vapor phase reducing agent, water vapor, and/or other byproducts of the reduction reaction are removed in this step, along with any other compound in the vapor phase, for example, an inert gas. In some of these embodiments, the purge gas comprises another gas, for example, a gas comprising a volatilizing etchant, discussed in greater detail below.

FIG. 2B is a cross section of the structure 200 after step 110, which comprises a surface 220, a high-k material 240, and a reduced material 260. In the illustrated embodiment, a portion of the high-k material 240 remains after step 110. In other embodiments, substantially all of the high-k material 240 is converted into the reduced material 260. The degree to which the high-k material 240 is converted into the reduced material 260 depends on factors including the thickness of the high-k material, the identity of the high-k material, porosity of the high-k material, plasma pulsing parameters of the hydrogen plasma, plasma power, plasma pressure, exposure time to the reducing agent, and temperature. Those skilled in the art will understand that the degree of conversion of the high-k material 240 into reduced material 260 is user controllable to a degree, but is typically self limiting, presumably by the ability of the reducing agent to diffuse through the high-k material 240.

In the illustrated embodiment, the high-k material 240 and the reduced material 260 form defined layers. In such embodiments, the degree of etching is expressible as a depth or thickness of the reduced material 260. In some embodiments, the thickness of the reduced material 240 is up to about 200 Å, preferably, from about 5 Å to about 100 Å, more preferably, from about 5 Å to about 40 Å, most preferably, from about 5 Å to about 20 Å.

In other embodiments, the high-k material 240 and the reduced material 260 have another structure. For example, some embodiments comprise an interfacial or transitional layer between the high-k material 240 and the reduced material 260 comprising a mixture of the high-k and reduced materials. In another structure, one or both of the high-k material 240 and the reduced material 260 is in the form of discrete particles and/or aggregates, either alone, or in admixture.

Without being bound by any theory, it is believed that portions of the reduced material 260 comprise one or more of the metals of the high-k material 240 in elemental form. For example, where the high-k material 240 is $HfO_2$, it is believed that the reduced material is substantially metallic hafnium. In embodiments using a hydrogen plasma as the reducing agent, it is believed that the hydrogen plasma reacts with the high-k material according to Eq. 1, forming water and the elemental metal. In Eq. 1, "$MO_x$" is a high-k material and "M" is a reduced material. Some embodiments of the reduced material are believed to comprise other compounds, for example, lower oxides and/or lower hydrous oxides.

$$MO_x(s)+H_2(\text{plasma})\rightarrow M(s)+xH_2O(g) \quad \text{Eq. 1}$$

In step 120, the structure 200 is contacted with one or more volatilizing etchants that effectively react with the reduced material 260 to provide a vapor phase product, thereby etching the reduced material 260. Preferably, at least a portion of each volatilizing etchant is in the vapor phase under the reaction conditions. In some embodiments, the volatilizing etchant does not substantially etch the high-k material 240 and/or surface 220 under the etching conditions, or etches that high-k material 240 at a rate that is much lower than the rate at which the reduced material 260 is etched. Embodiments in which the volatilizing etchant does not etch the high-k material 240 are self-limiting or selective because the etching reaction effectively stops when the accessible reduced material is etched away.

The volatilizing etchant is any suitable composition that effectively etches the reduced material 260 through a reaction that forms a vapor phase product of the reduced material. Examples of suitable volatilizing etchants comprise reactive halide species, β-diketonates, alcohols, amines, phosphines, alkenes, alkynes, carbon monoxide, combinations, and the like. Those skilled in the art will understand that the suitability of a volatilizing etchant will depend on factors known in the art, including, the identity of the reduced material, the identities of other materials present (e.g., high-k material 240, surface 220), the etching conditions (e.g., temperature, pressure, time, activation), and the like. In some embodiments, a volatilizing etchant is activated, for example, by thermal activation, by plasma activation, and/or by photo activation. In some embodiments, some volatilizing etchants will etch a particular reduced material 260 under particular conditions, while others will not.

Some embodiments use a plurality of volatilizing etchants, each volatilizing etchant etching one of a plurality of metals in the reduced material 260. Some embodiments use a plurality of volatilizing etchants for etching a single metal in the reduced material 260, for example, by reacting to form a volatile product comprising ligands derived from each of the volatilizing etchants. In some embodiments, the reduced material 260 is contacted with a plurality of volatilizing etchants substantially concurrently, while in other embodiments, the reduced material 260 is contacted with a plurality of volatilizing etchants sequentially. Some embodiments comprise both concurrent and sequential contact with a plurality of volatilizing etchants.

Contact times between the volatilizing etchant and the structure 200 depend on factors known in the art, for example, the identities of the volatilizing etchant, the identity of the reduced material 260, the reaction conditions, and the desired degree of etching. Exemplary contact times are from about 0.5 sec to about 20 sec, more preferably, from about 0.5 sec to about 2 sec. In some embodiments, the contact between the volatilizing etchant and the structure 200 is substantially continuous. In some preferred embodiments, the volatilizing etchant pulsed in a sequence comprising a pulse duration and a pulse separation. Suitable pulse durations are from about 0.5 sec to about 5 sec. Suitable pulse separations are from about 1 sec to about 2 sec. In some embodiments, the total number of pulses of the volatilizing etchant is up to about 1,000, more preferably, up to about 500. Those skilled in the art will understand that in embodiments in which the volatilizing etchant is the product of plasma activation, pulsing is accomplished by pulsing the volatilizing etchant, pulsing the RF power, or pulsing both.

In some preferred embodiments, the volatilizing etchant comprises a reactive halide species, more preferably, a vapor phase reactive halide species, for example, species comprising F, Cl, Br, I, or combinations thereof. Halides are also generically referred to herein using the symbol "X." A reactive halide species is any species known in the art that transfers one or more halide atoms to the reduced material 260, thereby etching the reduced material.

In some embodiments, the reactive halide species is in the vapor phase. In some embodiments, a halide source material is used to generate an effective concentration of the reactive halide species, for example, by evaporation of a halide source material in a condensed phase, for example, by heating and/or reducing the ambient pressure. In some embodiments, the halide source material is sparged using, for example, a carrier or inert gas. Suitable carrier gases are known in the art, for example, nitrogen, helium, and argon. In some embodiments, the halide source material is aerosolized, optionally in a carrier or inert gas. In other embodiments, an effective concentration of the halide source material is in the vapor phase under the reaction conditions, for example, where the halide source material is a gas under ambient conditions. In some of these embodiments, the halide source material is substantially identical with the reactive halide species.

In some embodiments, the reactive halide species comprises the product of plasma activation of a halide source material. Suitable conditions for plasma activation are known in the art. Those skilled in the art will understand that the particular conditions will depend on factors known in the art, including the identity of the halide source material, the identity of the reduced material 240, the desired degree of etching, the presence of other materials, and the like. In some preferred embodiments, the plasma is an in situ, for example, generated using the electrodes 312, and/or a remote plasma, for example, generated using a remote plasma generator 372, depending on the reactor configuration. Suitable apparatus for generating in situ and remote plasmas are discussed above. In some preferred embodiments, the halide source material is mixed with a carrier or inert gas in forming the plasma.

In some embodiments, the etching reaction between the reactive halide species and the reduced material 260 is a thermally activated reaction. Methods for thermal activation are known in the art and depend on the configuration of the particular reaction apparatus, for example, resistive heaters and/or heat lamps (not illustrated). Other embodiments use another form of activation, for example, photo activation, using, for example, ultraviolet radiation and/or laser activation (not illustrated). Other embodiments use a combination of plasma, thermal, and photo activation.

The halide source material is any suitable material that will transfer one or more halide atoms to the reduced material under the reaction conditions. Examples of suitable halide source materials include metal halides, for example, $TiCl_4$, $NbCl_5$, $NbBr_5$, $TaCl_5$, $TaBr_5$, $MoF_6$, $WF_6$, $BCl_3$, $SnCl_4$, $SnBr_4$, organic halogen compounds, for example, $CF_2Cl_2$, $CBr_4$, CFCF, and the like, elemental halogens, for example, $F_2$, $Cl_2$, $Br_2$, or $I_2$, interhalogens, for example, FCl, ClBr, ClI, hydrogen halides, for example, HF, HCl, HBr, or HI, cyanogen halides, and other suitable halide source materials known in the art including non-metal halides, for example, $XeF_2$ and $PCl_5$. In some embodiments, the halide source material comprises a plurality of types of halide atoms, for example, chlorine and fluorine. In some preferred embodiments, the halide source material is at least one of $BCl_3$, $CF_2Cl_2$, $NbCl_5$, $TaCl_5$, and $WCl_6$. Mixtures, analogs, and combinations are also suitable.

Reactive halide species are suitable for etching reduced materials 260 that react to form volatile halides, for example, metal halides, metal oxyhalide, and/or metal hydroxyhalides. Examples include reduced materials 260 resulting from the reduction in step 110 of $Al_2O_3$, $TiO_2$, $ZrO_2$, $HfO_2$, $Nb_2O_5$, $Ta_2O_5$, $MoO_x$ (e.g., $MoO_3$) $WO_x$ (e.g., $WO_3$), metal silicates (e.g., $M_xSi_yO_z$), metal titanates (e.g., $Sr_xTi_yO_z$), combinations, analogs, and the like.

Examples of suitable β-diketone volatilizing etchants include β-diketones known in the art, and include acetylacetone (2,4-pentanedione, acac), hexafluoroacetylacetone (1,1,1,5,5,5-hexafluoro-2,4-pentanedione, hfac), tetramethylheptanedione (2,2,6,6-tetramethyl-3,5-heptanedione, thd), 1,1,1,2,2-pentafluoro-6,6-dimethyl-3,5-heptanedione, trifluoroacetylacetone (1,1,1-trifluoro-2,4-pentanedione, tfac), combinations, analogs, and the like. Examples of suitable reduced materials for etching by β-diketonates include reduced materials 260 resulting from the reduction in step 110 of strontium bismuth tantalates (e.g., $SrBi_2Ta_2O_9$, SBT), barium strontium titanates (e.g., $Ba_{1-x}Sr_xTiO_3$, BST), combinations, analogs, and the like.

Examples of suitable alcohol volatilizing etchants include t-butanol, perfluoro-t-butanol, combinations, analogs, and the like. Examples of suitable phosphine volatilizing etchants include trimethylphosphine, bis(dimethylphosphino)ethane (dmpe), trifluorophosphine ($PF_3$), combinations, analogs, and the like. Examples of suitable amine volatilizing etchants include trimethylamine, N-methylpyrrolidine, N-methylpiperidine, quinuclidine, combinations, analogs, and the like. Examples of suitable alkene volatilizing etchants include ethylene, propylene, 2-butene, vinyltrimethylsilane, 3,3-dimethyl-1-butene, cyclopentadiene, cyclooctadiene, cyclooctatetraene, combinations, analogs, and the like. Example of suitable alkyne volatilizing etchants include acetylene, propyne, 2-butyne, 3,3-dimethyl-1-butyne, bis(trimethylsilyl)acetylene, combinations, analogs, and the like.

In some embodiments, the volatilizing etchant is removed after etching the reduced material in step 120, for example, by purging with a gas and/or by fluidly connecting the vapor phase with a vacuum source. In some embodiments, the gas comprises an inert gas are known in the art, for example, $N_2$, He, and/or Ar. Other vapor phase species are also removed, for example, vapor phase products of the etching reaction (discussed in greater detail below), and/or byproducts formed, for example, in the generation of the vapor phase reactive halide species and/or in reactions with other materials present in the reactor. Those skilled in the art will understand that in embodiments in which the reactive halide species is plasma enhanced, the plasma activated species cease to exist with the plasma discharge is terminated. In these embodiments, the halide source material (the precursor of the reactive halide species), other products of the etching reaction, and/or products of the plasma discharge are removed in this step, along with other compounds in the vapor phase, for example, an inert gas. In some embodiments, the purge gas comprises another gas, for example, hydrogen, which is useful for generating a reducing species, as discussed above.

FIG. 2C illustrates a cross section of the structure 200 after step 120, which comprises the surface 220 and high-k material 240. Preferably, substantially all of the reduced material (260 in FIG. 2B) is removed by the volatilizing etchant. In other embodiments, the remaining reduced material 260 has a different morphology, for example, as particles and/or aggregates on the surface of the high-k material 240, and/or interspersed with the high-k material 240 (not illustrated).

Without being bound by any theory, it is believed that the volatilizing etchant reacts with one or more components of the reduced material 260 to generate one or more vapor phase products. For example, where the volatilizing etchant is a reactive halide species, the reactive halide species is believed to etch the reduced material 260 by reacting with the elemental metal, lower oxide, and/or lower hydrous oxide to form a metal halide and/or metal oxyhalide, which is also referred to herein as an "etch product." In some preferred embodiments, the etch product is in the vapor phase under the conditions of step 120. In some preferred embodiments, at least one product of the portion of the reactive halide species and/or halide source material that is not transferred to the reduced material 260, also referred to herein as the "side product," is in the vapor phase under the conditions of step 120. Those skilled in the art will understand that in some embodiments, the side product(s) is a primary product of the reaction between the reactive halide species and the reduced material 260, while in other embodiments, the side product(s) is a secondary product.

In some more preferred embodiments, substantially all of the products of this reaction are in the vapor phase, for example, substantially all of the etch product(s), as well as substantially all of the side product(s). This embodiment is illustrated in Eq. 2, where "M" is a reduced material, "X" is a halide, "R—X" is a reactive halide species and/or halide source material, "$MX_n$" the etch product, and "R" is a primary side product.

$$M(s) + nR\text{—}X(g) \rightarrow MX_n(g) + nR(g) \qquad \text{Eq. 2}$$

In the embodiment illustrated in Eq. 3, the volatilizing etchant is a diketone. In this embodiment, the primary side product is $H_2$. Those skilled in the art will recognize analogous mechanisms when etching using other volatilizing etchants and/or a plurality of volatilizing etchants, as well as when etching metal oxides and/or hydrous oxides using one or more volatilizing etchants.

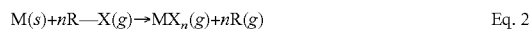

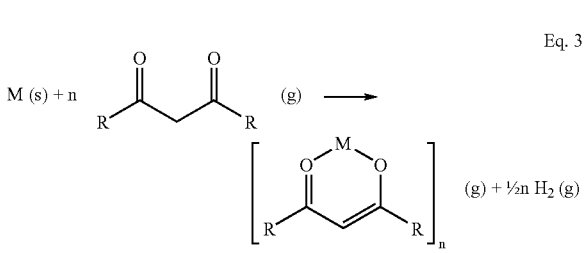

Eq. 3

Steps 110 and 120 are preferably performed in the same module and/or reaction chamber. In other embodiments, steps 110 and 120 are performed in different modules and/or reaction chambers. In some of these embodiments, the sample 200 is transferred between the modules without breaking vacuum.

In step 130, steps 110 and 120 are repeated until the desired degree of etching of the high-k material 240 is achieved. In some embodiments, substantially all of the high-k material 220 is etched away, for example, when cleaning an apparatus. In other embodiments, at least a portion of the high-k material 220 is not etched away, for example, to obtain a residual layer of high-k material 220 with a desired thickness.

Figure 2D:
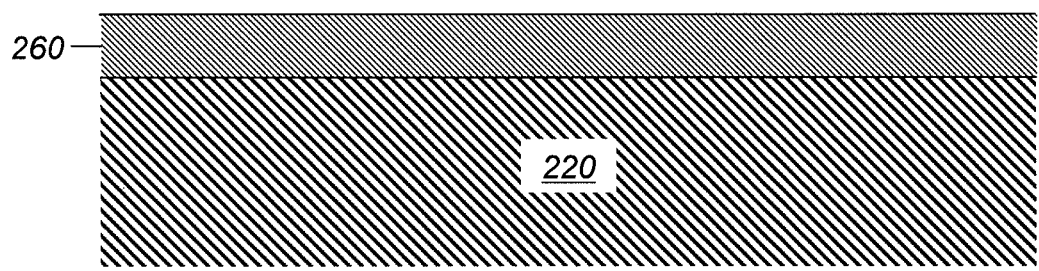
Figure 2E:

For example, FIG. 2D illustrates the structure 200 after repeating step 110 on the structure illustrated in FIG. 2C, thereby reducing the high-k material (FIG. 2C, 240). The structure 200 comprises a surface 220 and reduced material 260. In the illustrated embodiment, substantially all of the high-k material (FIG. 2C, 240) has been reduced. FIG. 2E illustrates the structure of FIG. 2D after completely etching away the reduced material (FIG. 2D, 260) by repeating step 120 to provide the clean surface 200.

Preferably, the reducing agent and volatilizing etchant are pulsed: that is steps 110 and 120 are substantially non-contemporaneous. For example, in some embodiments, the high-k material is contacted with a pulse of hydrogen plasma in step 110. After the end of the hydrogen plasma pulse, the substrate is then contacted with a pulse of the volatilizing etchant in step 120. The system is then optionally purged, for example using an inert gas, as discussed above. In step 130, the pulsed reduction 110 and etching 120 steps are repeated in a cyclical process until the desired degree of etching is achieved. As discussed above, in some embodiments, the pulse durations of the reducing agent and/or the volatilizing etchant are independently from about 0.5 sec to about 5 sec, with pulse separations of from about 1 sec to about 2 sec. Embodiments of a pulsed etching method are self-limiting: the reduction of the high-k material in step 110 is limited by the depth to which the reducing agent will diffuse; subsequently, the volatilizing etchant used in step 120 etches the reduced material selectively over the high-k material. At the end of the cyclical process, in cases where all high-k dielectric is to be removed from over a different material, the last sub-layer of reduced material can be more selectively removed, compared to the high-k material, without attacking the underlying surface. Thus, selectivity can be improved, as can control over the extent of etching, even where complete removal is not desired.

Methods for monitoring the progress of the etching process are known in the art. In some embodiments, the high-k material 240 is monitored. In other embodiments, the reduced material 260 is monitored. In other embodiments, the surface 220 is monitored. In other embodiments, one or more of the etch product(s) and/or side product(s) is monitored. Other embodiments monitor some combination of these materials. In some embodiments, the progress is monitored using one or more spectroscopic methods known in the art, for example, mass spectroscopy (MS), infrared (IR) spectroscopy, Raman spectroscopy, UV-visible spectroscopy, nuclear magnetic resonance spectroscopy (NMR), atomic absorption spectroscopy (AA), X-ray spectroscopy, plasma emission spectroscopy, or combinations thereof. In some embodiments, the thickness or presence of the high-k material 240 and/or reduced material 260 is monitored by means known in the art, for example, optical microscopy, electron microscopy, scanning probe microscopy, and combinations thereof. In other embodiments, the process is monitored electronically using methods known in the art, for example, by measuring resistance, conductance, reactance, capacitance, inductance and combinations thereof.

Preferred embodiments of the method and systems are illustrated in the following Examples, which are exemplary only, and not meant to limit the disclosure.

EXAMPLE 1

A 500 nm $Ta_2O_5$ film is deposited by ALD on the (110) surface of a 200 mm, single crystal silicon substrate using 10,000 cycles of the following sequence:

| Step | Reagent | Time |
|---|---|---|
| 1 | Tantalum tris(diethylamino) t-butylimide (TBTDET) pulse | 0.5 sec |
| 2 | Ar purge | 2 sec |
| 3 | $H_2O$ pulse | 1 sec |
| 4 | Ar purge | 2 sec |

The deposition temperature is 250° C. and the pressure 3 torr.

The $Ta_2O_5$ film is etched using the following pulsed-etch sequence:

| Step | Reagent | Time |
|---|---|---|
| 1 | $H_2$ plasma pulse | 5 sec |
| 2 | $WF_6$ pulse | 10 sec |
| 3 | Ar purge | 5 sec |

The $H_2$-plasma power is 400 W, the etching temperature was 250° C., and the pressure is 3 torr. Etching was complete after about 167 etching cycles (~30 Å/cycle).

EXAMPLE 2

In this example, a $HfO_2$ film is etched from a metal surface using a hydrogen plasma in step 110 and a chlorine plasma in step 120 according to Eq. 4 and Eq. 5, where Hf|HfO$_2$ (s) indicates elemental hafnium (reduced material) on unreduced hafnium oxide (high-k material). The steps are repeated cyclically until the desired film thickness is removed.

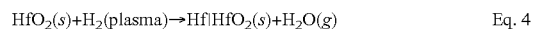

$$HfO_2(s) + H_2(plasma) \rightarrow Hf|HfO_2(s) + H_2O(g) \quad \text{Eq. 4}$$

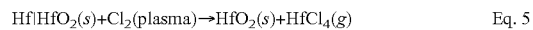

$$Hf|HfO_2(s) + Cl_2(plasma) \rightarrow HfO_2(s) + HfCl_4(g) \quad \text{Eq. 5}$$

EXAMPLE 3

In this example, an $Al_2O_3$ film is etched from a metal surface using a hydrogen plasma and titanium(IV) chloride according to Eq. 6 and Eq. 7.

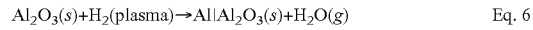

$$Al_2O_3(s) + H_2(plasma) \rightarrow Al|Al_2O_3(s) + H_2O(g) \quad \text{Eq. 6}$$

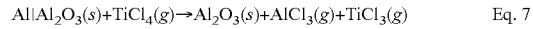

$$Al|Al_2O_3(s) + TiCl_4(g) \rightarrow Al_2O_3(s) + AlCl_3(g) + TiCl_3(g) \quad \text{Eq. 7}$$

EXAMPLE 4

In this example, an $ZrO_2$ film is etched from a metal surface using a hydrogen plasma and niobium(V) chloride according to Eq. 8 and Eq. 9.

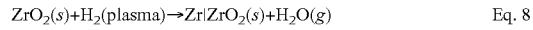

$$ZrO_2(s) + H_2(plasma) \rightarrow Zr|ZrO_2(s) + H_2O(g) \quad \text{Eq. 8}$$

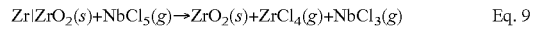

$$Zr|ZrO_2(s) + NbCl_5(g) \rightarrow ZrO_2(s) + ZrCl_4(g) + NbCl_3(g) \quad \text{Eq. 9}$$

EXAMPLE 5

In this example, an $Ta_2O_5$ film is etched from a metal surface using a hydrogen plasma and difluorodichloromethane according to Eq. 10 and Eq. 11.

$$Ta_2O_5(s)+H_2(plasma) \rightarrow Ta|Ta_2O_5(s)+H_2O(g) \quad \text{Eq. 10}$$

$$Ta|Ta_2O_5(s)+CF_2Cl_2(g) \rightarrow Ta_2O_5(s)+TaCl_5(g)+C_2F_4(g) \quad \text{Eq. 11}$$

EXAMPLE 6

In this example, a $SrBi_2Ta_2O_9$ film is etched from a metal surface using a hydrogen plasma, tetramethylheptanedione (thd), and difluorodichloromethane according to Eq. 12, Eq. 13, and Eq. 14.

$$SrBi_2Ta_2O_9(s)+H_2(plasma) \rightarrow SrBiTa|SrBi_2Ta_2O_9(s)+H_2O(g) \quad \text{Eq. 12}$$

$$SrBiTa|SrBi_2Ta_2O_9(s)+thd(g) \rightarrow Ta|SrBi_2Ta_2O_9(s)+Sr(thd)_2(g)+Ba(thd)_2(g) \quad \text{Eq. 13}$$

$$Ta|SrBi_2Ta_2O_9(s)+CF_2Cl_2(g) \rightarrow SrBi_2Ta_2O_9(s)+TaCl_5(g)+C_2F_4(g) \quad \text{Eq. 14}$$

The embodiments illustrated and described above are provided only as examples of certain preferred embodiments. Various changes and modifications can be made to the embodiments presented herein by those skilled in the art without departure from the spirit and scope of the disclosure, which is limited only by the appended claims.

What is claimed:

1. A method of etching a high-k material, comprising the sequential steps of:
   (a) contacting a high-k material with a pulse of a vapor phase reducing agent, thereby forming a chemically reduced material from the high-k material;
   (b) discontinuing contact with the vapor phase reducing agent; and
   (c) contacting the chemically reduced material with a pulse of a vapor phase volatilizing etchant in the absence of the vapor phase reducing agent, thereby removing at least a portion of the chemically reduced material.

2. The method of claim 1, further comprising purging with an inert gas after at least one of step (a) or step (c).

3. The method of claim 1, wherein the chemically reduced material is substantially completely etched away.

4. The method of claim 1, wherein the high-k material is formed over at least a portion of a semiconductor substrate.

5. The method of claim 1, wherein the high-k material is formed over at least a portion of a reaction apparatus.

6. The method of claim 1, wherein the high-k material is formed using at least one of a CVD-type process and an ALD-type process.

7. The method of claim 1, wherein the high-k material comprises a material selected from $Al_2O_3$, $TiO_2$, $ZrO_2$, $HfO_2$, $Nb_2O_5$, $Ta_2O_5$, $MoO_x$, $WO_x$, metal silicates, metal titanates, strontium bismuth tantalates, barium strontium titanates, and combinations thereof.

8. The method of claim 1, wherein the chemically reduced material comprises a metallic material.

9. The method of claim 1, wherein the chemically reduced material comprises a lower oxide of the high-k material.

10. The method of claim 1, further comprising removing remaining vapor phase reducing agent by purging with an inert gas while discontinuing contact with the vapor phase reducing agent.

11. The method of claim 1, further comprising removing remaining vapor phase reducing agent by employing a vacuum source while discontinuing contact with the vapor phase reducing agent.

12. The method of claim 1, wherein steps (a), (b), and (c) are cyclically repeated until a desired amount of the high-k material has been removed.

13. The method of claim 12, wherein each cycle of repeating steps (a), (b), and (c) removes from about 5 Å to about 100 Å of the high-k material.

14. The method of claim 1, further comprising discontinuing contact with the vapor phase volatilizing etchant and removing the vapor phase volatilizing etchant after step (c).

15. The method of claim 14, wherein removing comprises purging with an inert gas.

16. The method of claim 14, wherein removing comprises employing a vacuum source.

17. The method of claim 1, wherein contacting the high-k material with the vapor phase reducing agent forms the chemically reduced material as an elemental metal.

18. The method of claim 17, wherein the volatilizing etchant substantially does not etch the unreduced high-k material under the contacting conditions.

19. The method of claim 17, wherein at least a portion of the chemically reduced material forms a layer up to about 200 Å thick.

20. The method of claim 1, wherein the volatilizing etchant comprises at least one of a reactive halide species, a β-diketonate, an alcohol, an amine, a phosphine, an alkene, an alkyne, and carbon monoxide.

21. The method of claim 20, wherein the volatilizing etchant comprises a reactive halide species formed in situ from a halide source material selected from the group consisting of metal halides, organic halogen compounds, elemental halogens, interhalogens, hydrogen halides, cyanogen halides, non-metal halides, and combinations thereof.

22. The method of claim 21, wherein the halide source material is selected from the group consisting of $TiCl_4$, $ZrCl_4$, $NbCl_5$, $TaCl_5$, $MoCl_6$, $WCl_6$, $BCl_3$, $CF_2Cl_2$, and combinations thereof.

23. The method of claim 20, wherein the volatilizing etchant comprises a β-diketone.

24. The method of claim 1, wherein at least one of step (a) or step (c) is plasma assisted.

25. The method of claim 24, wherein a plasma is generated in situ.

26. The method of claim 24, wherein a plasma is generated remotely.

27. The method of claim 24, wherein the vapor phase reducing agent comprises a hydrogen plasma.

28. The method of claim 27, wherein the hydrogen plasma is generated using one or more parameters are selected from the group consisting of RF power on time, RF power amplitude, RF power frequency, reactant concentration, reactant flow rate, reaction space pressure, total gas flow rate, reactant pulse duration, reactant pulse separation, and RF electrode spacing.

29. A method of etching a high-k material, comprising the sequential steps of:
   (a) contacting a high-k material with a pulse of a vapor phase reducing agent, thereby forming a chemically reduced material from the high-k material; and
   (b) contacting the chemically reduced material with a pulse of a vapor phase volatilizing etchant, in the absence of the vapor phase reducing agent, thereby removing at least a portion of the chemically reduced material, wherein each of step (a) and step (b) is substantially self-limiting.

30. A method for etching a high-k material comprising cyclically:
  contacting a high-k material formed over a surface with a vapor phase reducing agent effective for reducing at least a portion of the high-k material, thereby forming a chemically reduced material from the high-k material;
  discontinuing contact with the vapor phase reducing agent after contacting the high-k material; and
  contacting the chemically reduced material with a vapor phase reactive halide species effective for etching at least a portion of the chemically reduced material in the absence of the vapor phase reducing agent; and
  discontinuing contact with the vapor phase reactive halide species after contacting the chemically reduced material.

31. The method of claim 30, wherein the surface is at least a portion a semiconductor wafer.

32. The method of claim 30, wherein the surface is at least a portion of a high-k deposition apparatus.

33. The method of claim 30, wherein at least one of the contacting steps comprises pulsing with the aid of a carrier gas.

34. The method of claim 30, wherein the chemically reduced material comprises a metallic material.

35. The method of claim 30, wherein the chemically reduced material comprises a lower oxide of the high-k material.

36. The method of claim 30, further comprising purging with an inert gas during at least one of the discontinuing contact with the vapor phase reducing agent and the discontinuing contact with the vapor phase reactive halide species.

37. The method of claim 30, further comprising employing a vacuum source during at least one of the discontinuing contact with the vapor phase reducing agent and the discontinuing contact with the vapor phase reactive halide species.

* * * * *

UNITED STATES PATENT AND TRADEMARK OFFICE
CERTIFICATE OF CORRECTION

PATENT NO. : 8,809,195 B2
APPLICATION NO. : 12/254652
DATED : August 19, 2014
INVENTOR(S) : Kai-Erik Elers Page 1 of 1

It is certified that error appears in the above-identified patent and that said Letters Patent is hereby corrected as shown below:

In the Specification

In column 12 at line 24 (approx.), Change "etche" to --etch--.

In the Claims

In column 17 at line 20 (approx.), In Claim 31, change "portion a" to --portion of a--.

Signed and Sealed this
Seventh Day of April, 2015

Michelle K. Lee
*Director of the United States Patent and Trademark Office*